United States Patent
Chang

(10) Patent No.: US 10,290,701 B1
(45) Date of Patent: May 14, 2019

(54) MIM CAPACITOR, SEMICONDUCTOR STRUCTURE INCLUDING MIM CAPACITORS AND METHOD FOR MANUFACTURING THE SAME

(71) Applicant: TAIWAN SEMICONDUCTOR MANUFACTURING COMPANY LTD., Hsinchu (TW)

(72) Inventor: Yao-Wen Chang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 62 days.

(21) Appl. No.: 15/938,350

(22) Filed: Mar. 28, 2018

(51) Int. Cl.
*H01L 49/02* (2006.01)
*H01L 21/02* (2006.01)
*H01L 23/522* (2006.01)

(52) U.S. Cl.
CPC .......... *H01L 28/75* (2013.01); *H01L 21/0228* (2013.01); *H01L 23/5223* (2013.01); *H01L 28/55* (2013.01); *H01L 28/56* (2013.01); *H01L 28/57* (2013.01); *H01L 28/87* (2013.01)

(58) Field of Classification Search
CPC ..................... H01L 28/55–28/57; H01L 28/87
USPC .................................................... 257/532
See application file for complete search history.

(56) References Cited

U.S. PATENT DOCUMENTS

| | | | |
|---|---|---|---|
| 2009/0316332 A1* | 12/2009 | Okubo | H01G 4/008 361/311 |
| 2012/0049369 A1* | 3/2012 | Mitsuyama | H01L 21/7687 257/751 |
| 2015/0295019 A1* | 10/2015 | Wang | H01L 27/0805 257/532 |
| 2017/0271433 A1* | 9/2017 | Wang | H01L 28/60 |
| 2018/0197946 A1* | 7/2018 | Leobandung | H01L 28/92 |

\* cited by examiner

*Primary Examiner* — David Vu
*Assistant Examiner* — Brandon Fox
(74) *Attorney, Agent, or Firm* — WPAT, P.C., Intellectual Property Attorneys; Anthony King

(57) ABSTRACT

A MIM capacitor includes a bottom electrode, a middle electrode disposed over the bottom electrode, a top electrode disposed over the middle electrode, a first dielectric layer sandwiched between the bottom electrode and the middle electrode, and a second dielectric layer sandwiched between the middle electrode and the top electrode. A surface of the bottom electrode and a surface of the top electrode respectively comprise a Ra value lower than 0.35 nm and a Rq value lower than 0.4 nm.

20 Claims, 20 Drawing Sheets

MIM CAPACITOR, SEMICONDUCTOR STRUCTURE INCLUDING MIM CAPACITORS AND METHOD FOR MANUFACTURING THE SAME

BACKGROUND

Integrated chips are formed on semiconductor die including millions or billions of transistor devices. The transistor devices are configured to act as switches and/or to produce power gains so as to enable logical functionality for an integrated chip (e.g., form a processor configured to perform logic functions). Integrated chips often also include passive devices, such as capacitors, resistors, inductors, varistors, etc. Passive devices are widely used to control integrated chip characteristics (e.g., gain, time constants, etc.) and to provide an integrated chip with a wide range of different functionalities (e.g., manufacturing analog and digital circuitry on the same die).

Among the passive devices, capacitors such as the metal-insulator-metal (MIM) capacitors, which include at least a top metal plate and a bottom metal plate separated by a capacitor dielectric, are often implemented in integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
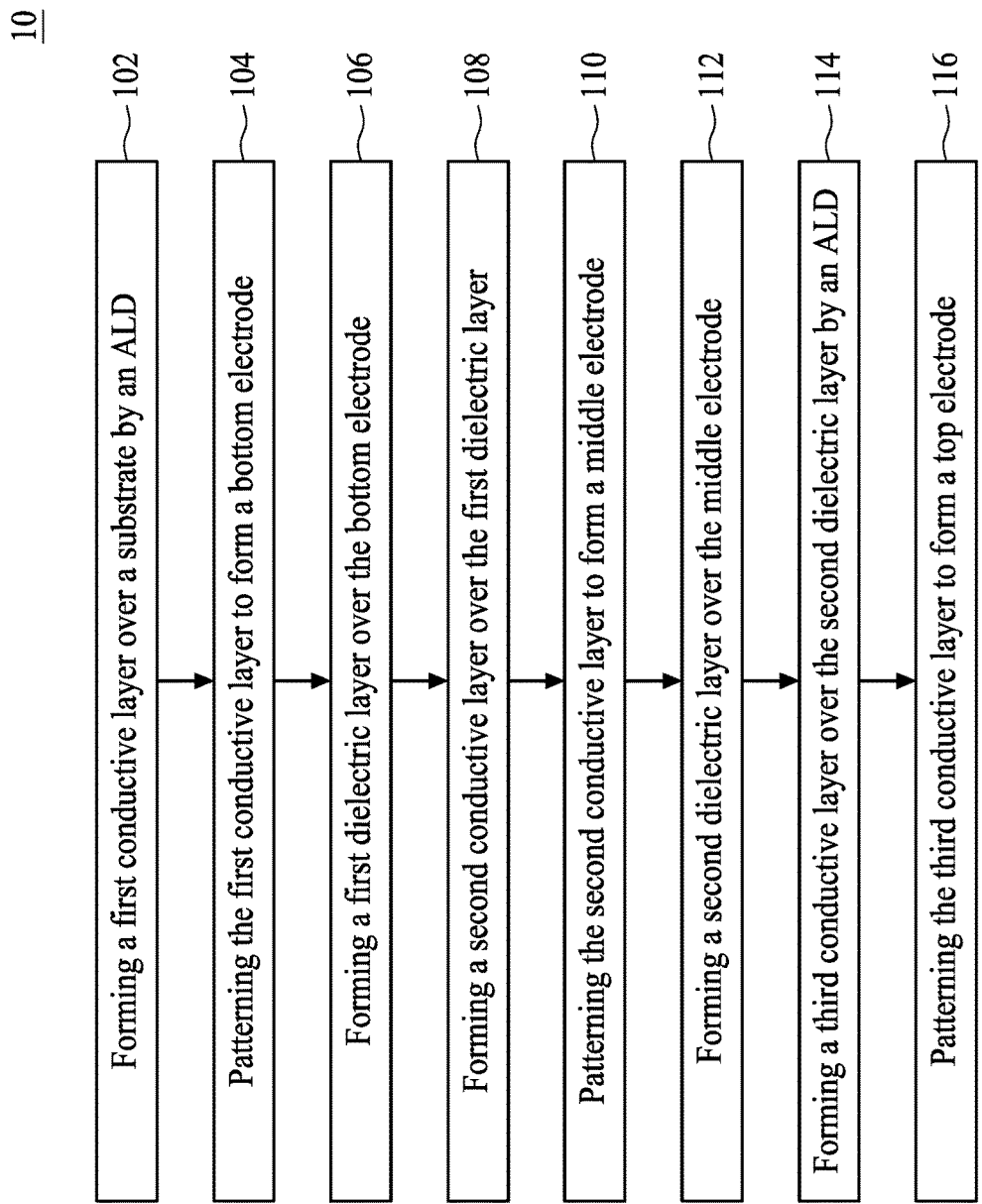
FIG. 1 is a flow chart representing a method for manufacturing a MIM capacitor according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% that numerical value, such as less than or equal to ±5%, less than or equal to ±4%, less than or equal to ±4%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to 14%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±4°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±4°, less than or equal to ±2°, less than or equal to ±1°, less than or equal to ±0.5°, less than or equal to ±0.1°, or less than or equal to ±0.05°.

MIM capacitors can be used as decoupling capacitors configured to mitigate power supply or switching noise caused by changes in current. In some embodiments, MIM capacitors are integrated in back-end-of-the-line (BEOL) metallization stack, at a position that is vertically disposed between an underlying metal layer and an overlying metal layer. However, positioning a MIM capacitor within a BEOL metallization stack can present a number of fabrication problems. For example, MIM capacitors typically have a large number of layers that lead to a topography (e.g., having a step size of more than 400 nanometers (nm)) which is greater than most of BEOL metallization layers. In some embodiments, MIM capacitors are therefore disposed over, instead of within, the BEOL metallization stack to avoid the topography problem. In some embodiments. MIM capacitors are disposed within or over a redistribution layer (RDL). However, it still faces other issue.

In some embodiments, when the electrodes are formed by physical vapor deposition, (PVD), a surface of the electrodes includes an arithmetical mean roughness (Ra) value greater than 0.65 nanometers (nm) and a root-mean-square roughness (Rq) value less than 0.7 nm. It should be understood that the surface roughness can be defined as an arithmetic mean Ra and a root mean square Rq. The arithmetic mean Ra indicates an arithmetic mean of each peak (according to highest and lowest parts of the surface of the first conductive layer), and the root mean square Rq indicates rms (root mean square). Simply speaking, the higher Ra and Rq values indicate a rough surface including countless recessed regions. Further, when forming a dielectric layer over the metal electrodes, the rough surface of the metal electrode may induce local thinner dielectric layer, which becomes a weak point. As mentioned above, the metal electrodes of MIM capacitor includes uneven topography, and it is observed that in some embodiments, electric field is concentrated due to the uneven topography, and the concentrated electrical field lowers the threshold voltage, Vt. Further, the lowered Vt and the local thinner dielectric layer together make breakdown occur at the weak point more easily and rapidly. On the other hand, when patterning or etching the metal electrodes, the dielectric layer underlying the recessed regions may be consumed and thus inherit such rough surface. Further, residues such as metallic polymer may accumulate or be trapped in the rough surface of the dielectric layer. Consequently, capacitance of the MIM capacitor is adversely impacted.

The present disclosure therefore provides a semiconductor structure including MIM capacitor and a method for manufacturing the same that is able to mitigate the rough surface issue, and thus to prevent breakdown and improve the MIM capacitor performance.

FIG. 1 is a flow chart representing a method for manufacturing a MIM capacitor 10 according to aspects of the present disclosure. The method for manufacturing the MIM capacitor 10 includes an operation 102, forming a first conductive layer over a substrate by an atomic layer deposition (ALD). The method 10 further includes an operation 104, patterning the first conductive layer to form a bottom electrode. The method 10 further includes an operation 106, forming a first dielectric layer over the bottom electrode. The method 10 further includes an operation 108, forming a second conductive over the first dielectric layer. In some embodiments, the second conductive layer can be formed by an ALD or a physical vapor deposition (PVD), but the disclosure is not limited to this. The method 10 further includes an operation 110, patterning the second conductive layer to form a middle electrode. The method 10 further includes an operation 112, forming a second dielectric layer over the middle electrode. The method 10 further includes an operation 114, forming a third conductive layer over the second dielectric layer by an ALD. The method 10 further includes an operation 116, patterning the third conductive layer to form a top electrode. The method 10 will be further described according to one or more embodiments. It should be noted that the operations of the method 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2:
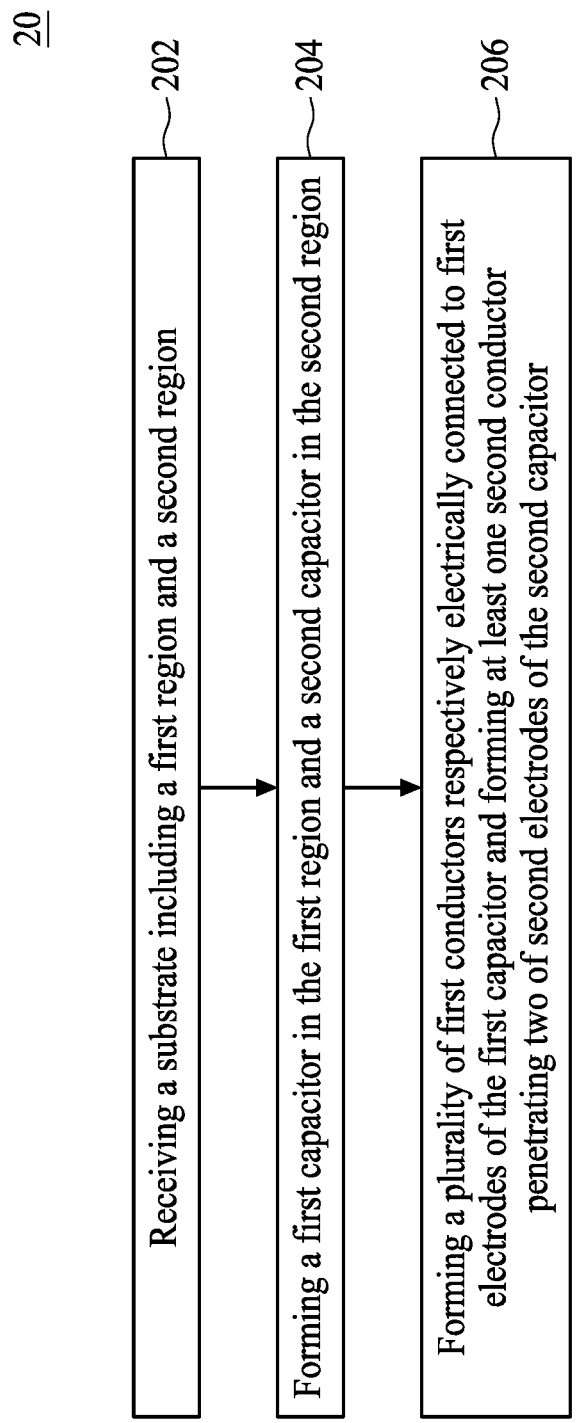
FIG. 2 is a flow chart representing a method for manufacturing a semiconductor structure including MIM capacitors according to aspects of the present disclosure.

FIG. 2 is a flow chart representing a method for manufacturing a semiconductor structure including MIM capacitors 20 according to aspects of the present disclosure. The method for manufacturing the semiconductor structure including the MIM capacitors 20 includes an operation 202, receiving a substrate. In some embodiments, the substrate includes a first region and a second region defined thereon. The method 20 further includes an operation 204, forming a first capacitor in the first region and a second capacitor in the second region. In some embodiments, operation 204 can further include the operations 102 to 116 of the method 10, but the disclosure is not limited to this. The method 20 further includes an operation 206, forming a plurality of first conductors respectively electrically connected to first electrodes of the first capacitor and forming at least one second conductor penetrating two of second electrodes of the second capacitor. The method 20 will be further described according to one or more embodiments. It should be noted that the operations of the method 20 may be rearranged or otherwise modified within the scope of the various aspects. It is further noted that additional processes may be provided before, during, and after the method 20, and that some other processes may only be briefly described herein. Thus other implementations are possible within the scope of the various aspects described herein.

Figure 3:
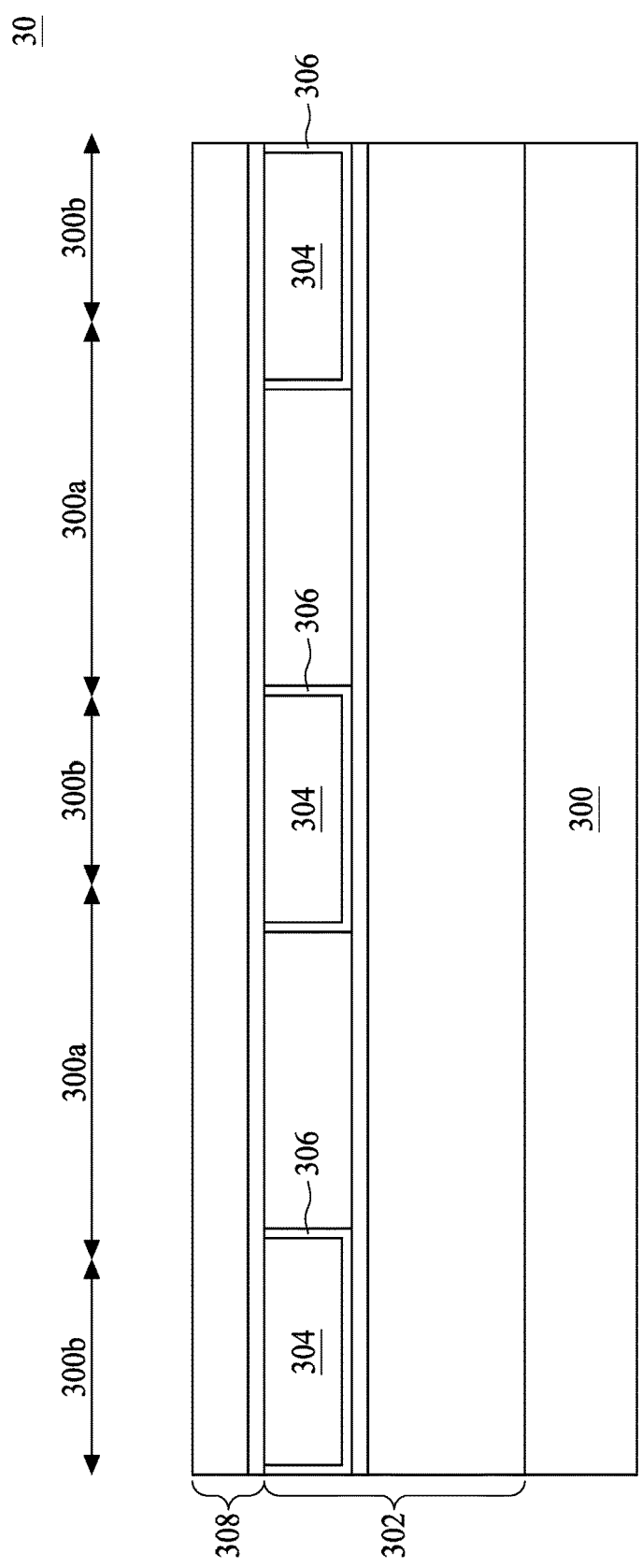
FIGS. 3-14 are schematic drawings illustrating a MIM capacitor at various fabrication stages constructed according to aspects of the present disclosure in one or more embodiments.

FIGS. 3-14 are schematic drawings illustrating a semiconductor structure includes MIM capacitors 30 at various fabrication stages constructed according to aspects of the present disclosure in one or more embodiments. In some embodiments, the semiconductor structure can be a die. Referring to FIG. 3, a substrate 300 is received or provided. The substrate 300 (also referred to as a die substrate) includes a semiconductor material, such as silicon (Si). In one embodiment, the substrate 300 may include other semiconductor materials, such as silicon germanium (SiGe), silicon carbide (SiC), gallium arsenide (GaAs), or the like. The substrate 300 may be a p-type semiconductive substrate (acceptor type) or an n-type semiconductive substrate (donor type). Alternatively, the substrate 300 may include another elementary semiconductor, such as Ge; a compound semiconductor including SiC, GaAs, gallium phosphide (GaP), indium phosphide (InP), indium arsenide (InAs), or indium antimonide (InSb); an alloy semiconductor including SiGe, GaAsP, AlInAs, AlGaAs, GaInAs, GaInP, or GaInAsP; or combinations thereof. In another alternative, the substrate 300 may be a semiconductor-on-insulator (SOI). In still other alternatives, the substrate 300 may include a doped epitaxial layer, a gradient semiconductor layer, or a semiconductor layer overlaying another semiconductor layer of a different type, such as a Si layer on a SiGe layer.

Various electrical components may be formed over the substrate 300. Examples of the electrical components include active devices, such as transistors and diodes, and passive devices, such as capacitors, inductors, and resistors. The electrical components may also include conductive features, such as conductive lines or conductive vias, and insulating features electrically insulating the conductive features. In some embodiments, the substrate 300 includes one or more connection terminals (not shown) that are utilized to conductively couple the electrical components of the substrate 300 to external circuits or devices.

A redistribution layer (RDL) 302 is formed over the substrate 300. The RDL 302 is configured to electrically connect its overlying components. In addition, the RDL 302 is configured to electrically couple its overlying components with the electrical components of the substrate 300. The RDL 302 may include multiple metal layers (not shown). Each of the metal layers may include conductive wires or lines and is electrically coupled to an adjacent overlaying or underlying metal layer through metal vias (not shown). Moreover, the metal lines and metal vias are electrically insulated from other components. The insulation may be achieved by insulating materials, such as an inter-metal dielectric (IMD). It should be noted that though only the topmost conductive layers 304 of the RDL 302 are shown in FIGS. 3-14, those skilled in the art would easily realize that other metal layers can be disposed in the insulating materials according to different design requirements. In some embodiments, the topmost conductive layers 304 may include a metal such as copper (Cu), tungsten (W), or aluminum (Al), but the disclosure is not limited to this. Additionally, a barrier layer 306 sandwiched between the conductive layers 304 and the IMD is provided to prevent metal diffusion, but the disclosure is not limited thereto. In some embodiments, the substrate 300 can include a first region 300a and a second region 300b defined thereon. Substantially, the second region 300b is defined as corresponding to the topmost conductive layer 304 as shown in FIG. 3, but the disclosure is not limited to this.

Still refer to FIG. 3, a protection layer 308 can be disposed over the RDL 302. In some embodiments, the protection layer 308 can be a multiple layer, but the disclosure is not limited to this. In some embodiments, the protection layer 308 may be formed with a variety of dielectric materials and may, for example, be oxide (e.g., Ge oxide), nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like. In an alternative embodiment, the protection layer 308 include a polymeric material such as polyimide (PI), polybenzoxazole (PBO), benzocyclobuten (BCB), epoxy, or the like. In some embodiments, the protection layer 308 can include a lower SiN layer and an upper plasma enhanced oxide (PEOX)-undoped silicate glass (USG) (PEOX-USG) layer, but the disclosure is not limited to this. The protection layer 308 may be formed using a CVD, PVD, spin-on coating, or other suitable operation. In an embodiment, the protection layer 308 has a thickness between approximately 4000 Angstroms (Å) and approximately 5000 Å, but the disclosure is not limited to this.

Figure 4A:
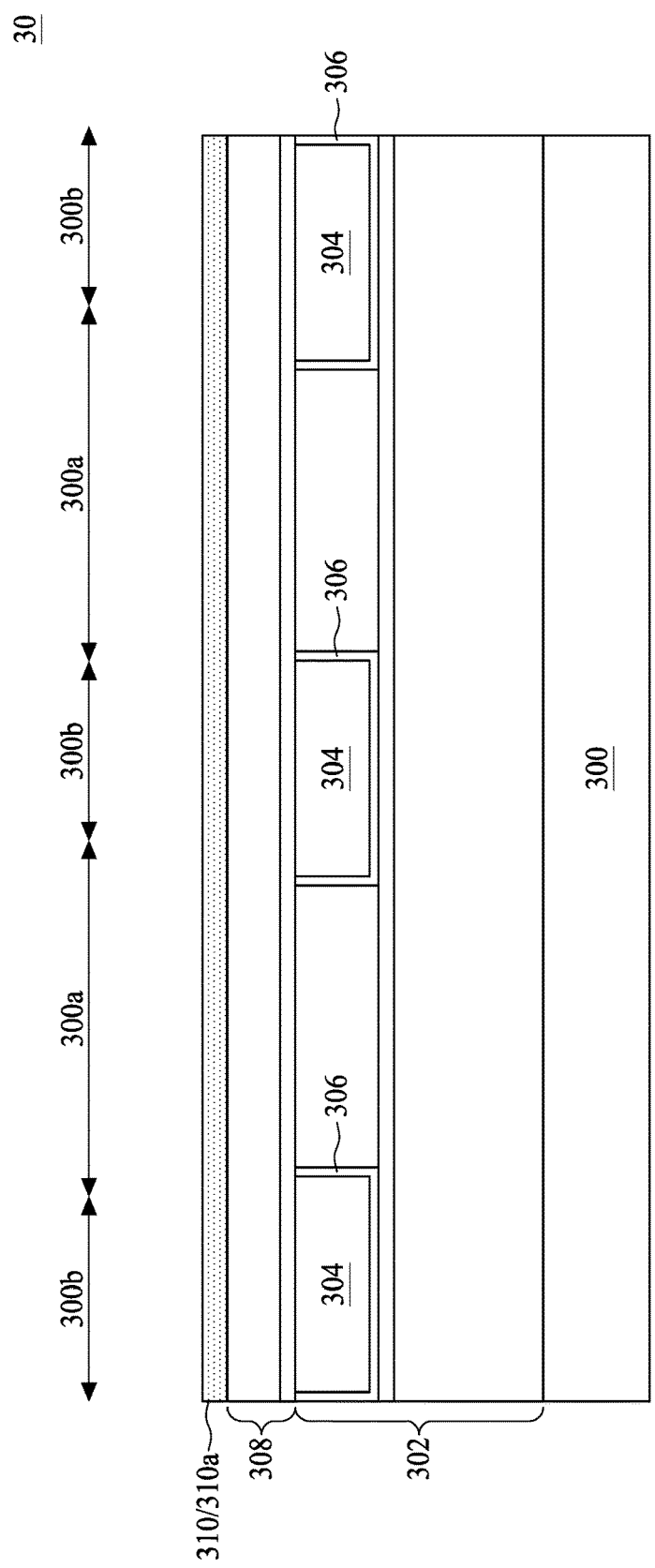

Referring to FIG. 4A, a first conductive layer 310 is formed over the substrate 300 according to operation 102. In some embodiments, the first conductive layer 310 can include various conductive materials, such as indium tin oxide (ITO), aluminum (Al), titanium (Ti), titanium nitride (TiN), tantalum (Ta), tantalum nitride (TaN), tungsten (W), tungsten nitride (WN), molybdenum nitride (MoN), copper (Cu), platinum (Pt), palladium (Pd), osmium (Os), ruthenium (Ru), iridium dioxide ($IrO_2$), rhenium dioxide ($ReO_2$), rhenium trioxide ($ReO_4$), or a combination thereof. In some embodiments, the first conductive layer 310 is a single conductive layer formed by an ALD. In some embodiments, a thickness of the ALD-formed first conductive layer 310a is between approximately 300 Å and approximately 500 Å, but the disclosure is not limited to this. In some embodiments, a surface of the ALD-formed first conductive layer 310a includes a Ra value less than 0.35 nm and a Rq value less than 0.4 nm. As mentioned above, the lower Ra and Rq values indicate a more uniform surface. In some embodiments of the present disclosure, a conductive layer completely formed by PVD includes Ra value greater than 0.65 and Rq value greater than 0.7. It is therefore concluded that the ALD-formed first conductive layer 310a includes a more uniform or smooth surface.

Figure 4B:
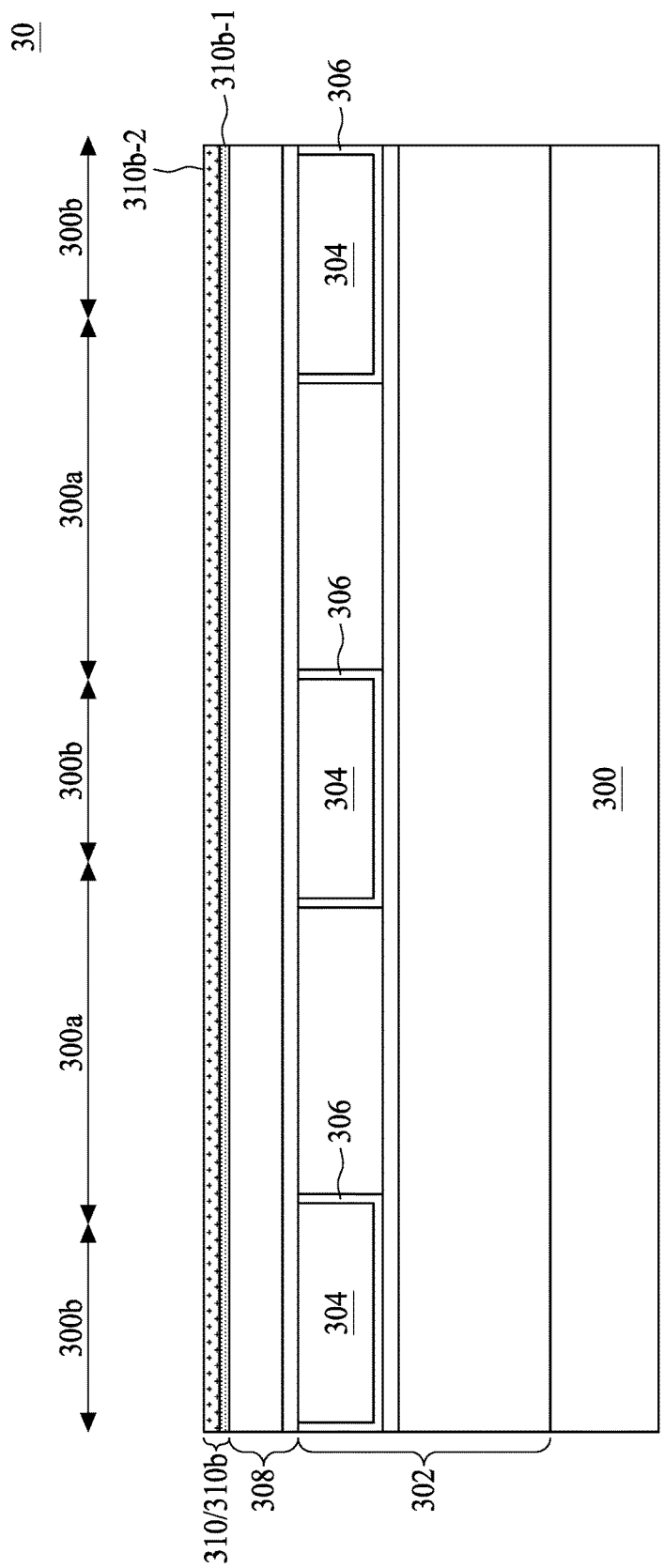

Referring to FIG. 4B, in some embodiments, the first conductive layer 310 can be a multiple conductive layer formed by an ALD and a PVD according to operation 102. And the PVD is performed after the ALD. In other words, the first conductive layer can be a multiple conductive layer 310b including an ALD-formed lower layer 310b-1 and a PVD-formed upper layer 310b-2, as shown in FIG. 4B. In some embodiments, a thickness of the ALD-formed first conductive layer 310b is between approximately 300 Å and approximately 500 Å, but the disclosure is not limited to this. In some embodiments, a ratio of a thickness of the PVD-formed upper layer 310b-2 over a thickness of the ALD-formed lower layer 310b-1 is greater than 2, but the disclosure is not limited to this. In some embodiments, the thickness of the ALD-formed lower layer 310b-1 is approximately less than 100 Å, but the disclosure is not limited to this. It should be noted that that ALD-formed lower layer 310b-1 includes an Ra value less than 0.35 nm and a Rq value less than 0.4 nm. Further, the ALD-formed lower 310b-1 serves as a smoother bottom layer and thus Ra value and Rq value of the PVD-formed upper layer 310b-2 are reduced. In other words, the PVD-formed upper layer 310b-2 therefore obtains a smoother surface when comparing with a PVD-formed layer overlaying a non ALD-formed layer.

Figure 5:
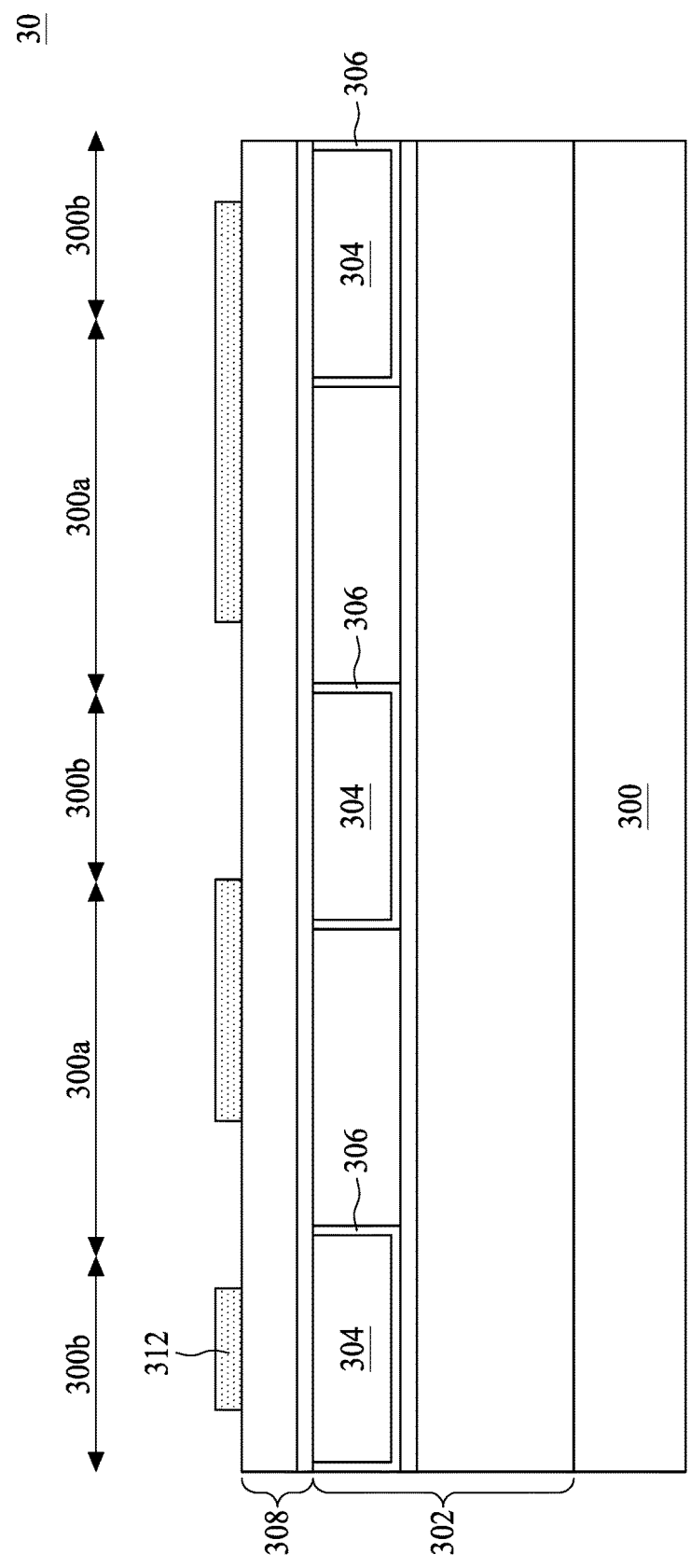

Referring to FIG. 5, the first conductive layer 310 is then patterned to form a bottom electrode 312 according to operation 104.

Figure 6:
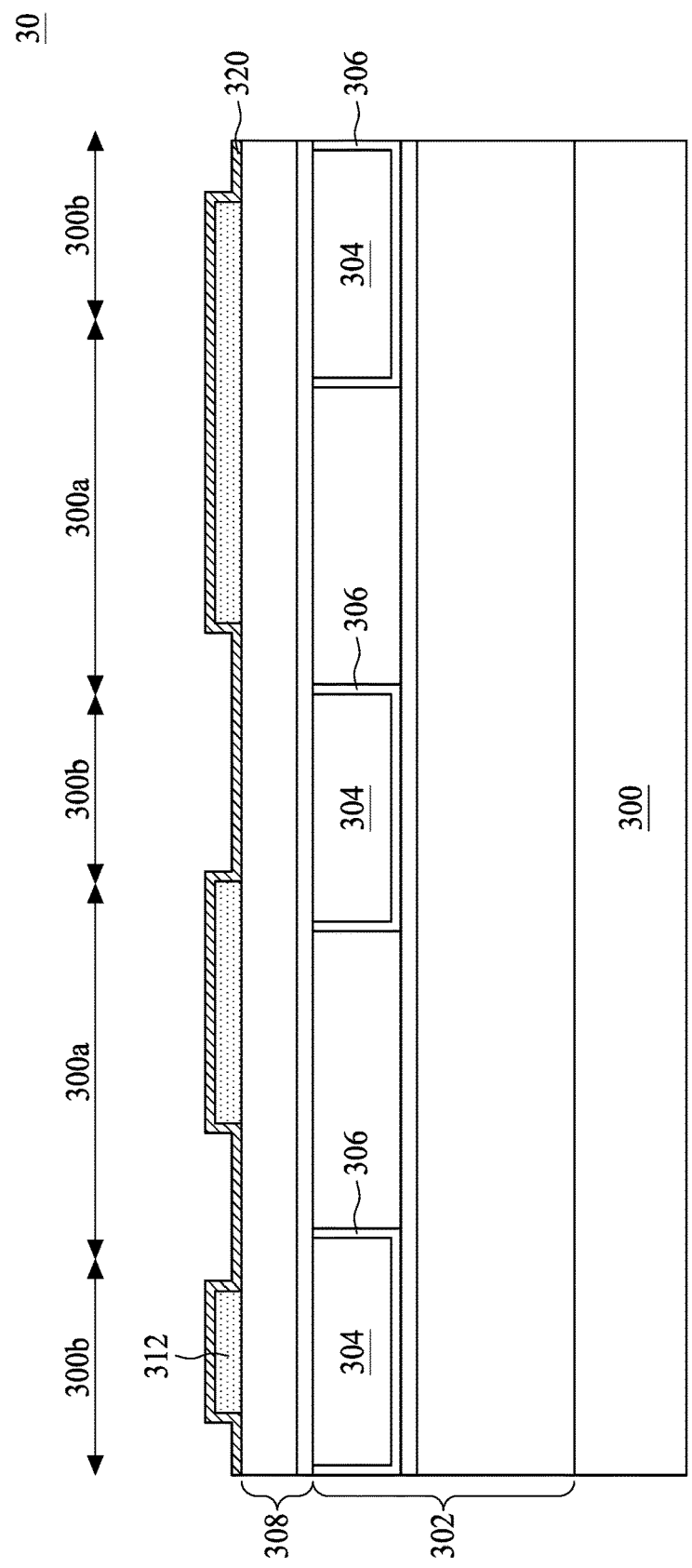

Referring FIG. 6, a first dielectric layer 320 is then formed over the bottom electrode 312 according to operation 106. Further, the first dielectric layer 320 is conformally formed to cover the bottom electrode 312. In some embodiments, the first dielectric layer 320 may include a high-k dielectric material (i.e., a dielectric material having a dielectric constant greater than silicon dioxide ($SiO_2$)). In various embodiments, the first dielectric layer 320 can include a single layer. In other embodiments, the first dielectric layer 320 can include a multiple layer of $SiO_2$, silicon nitride ($Si_3N_4$), aluminum oxide ($Al_2O_3$), tantalum oxide ($Ta_2O_5$), titanium oxide ($TiO_2$), strontium titanate ($SrTiO_3$), zirconium oxide ($ZrO_2$), hafnium oxide ($HfO_2$), hafnium silicate ($HfSiO_4$), lanthanum oxide ($La_2O_3$), yttrium oxide ($Y_2O_3$), etc. In some embodiments, a thickness of the first dielectric layer 320 can be between approximately 20 Å and approximately 200 Å, but the disclosure is not limited to this. In some embodiments, the first dielectric layer 320 may include stacked layers of $ZrO_2/Al_2O_3/ZrO_2$ (ZAZ), but the disclosure is not limited to this. In some embodiment, each layer of the ZAZ stack includes a thickness approximately 20 Å, but the disclosure is not limited thereto. It should be noted that since the underlying bottom electrode 312, which was previously the first conductive layer 310, includes a smoother surface, the first dielectric layer 320 is made even.

Figure 7A:
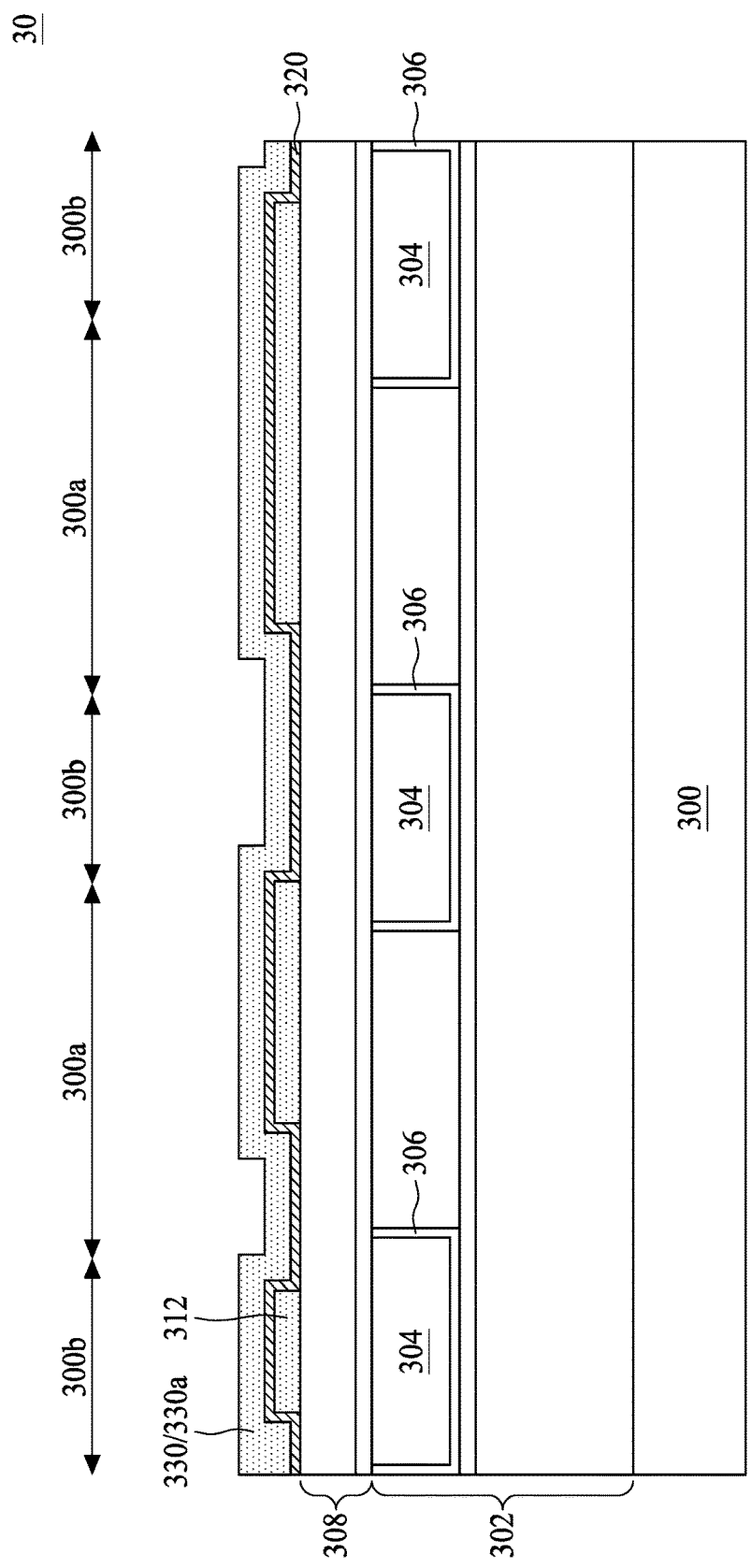

Referring to FIG. 7A, a second conductive layer 330 is formed over the first dielectric layer 320 according to operation 108. In some embodiments, the second conductive layer 330 can include materials and thickness the same as the first conductive layer 310, therefore those details are omitted for simplicity. In some embodiments, the second conductive layer 330 is a single conductive layer formed by an ALD or a PVD. In some embodiments, a surface of the ALD-formed second conductive layer 320a includes a Ra value less than 0.35 nm and a Rq value less than 0.4 nm, but the disclosure is not limited to this. As mentioned above, the ALD-formed second conductive layer 330a includes a smoother surface.

Figure 7B:
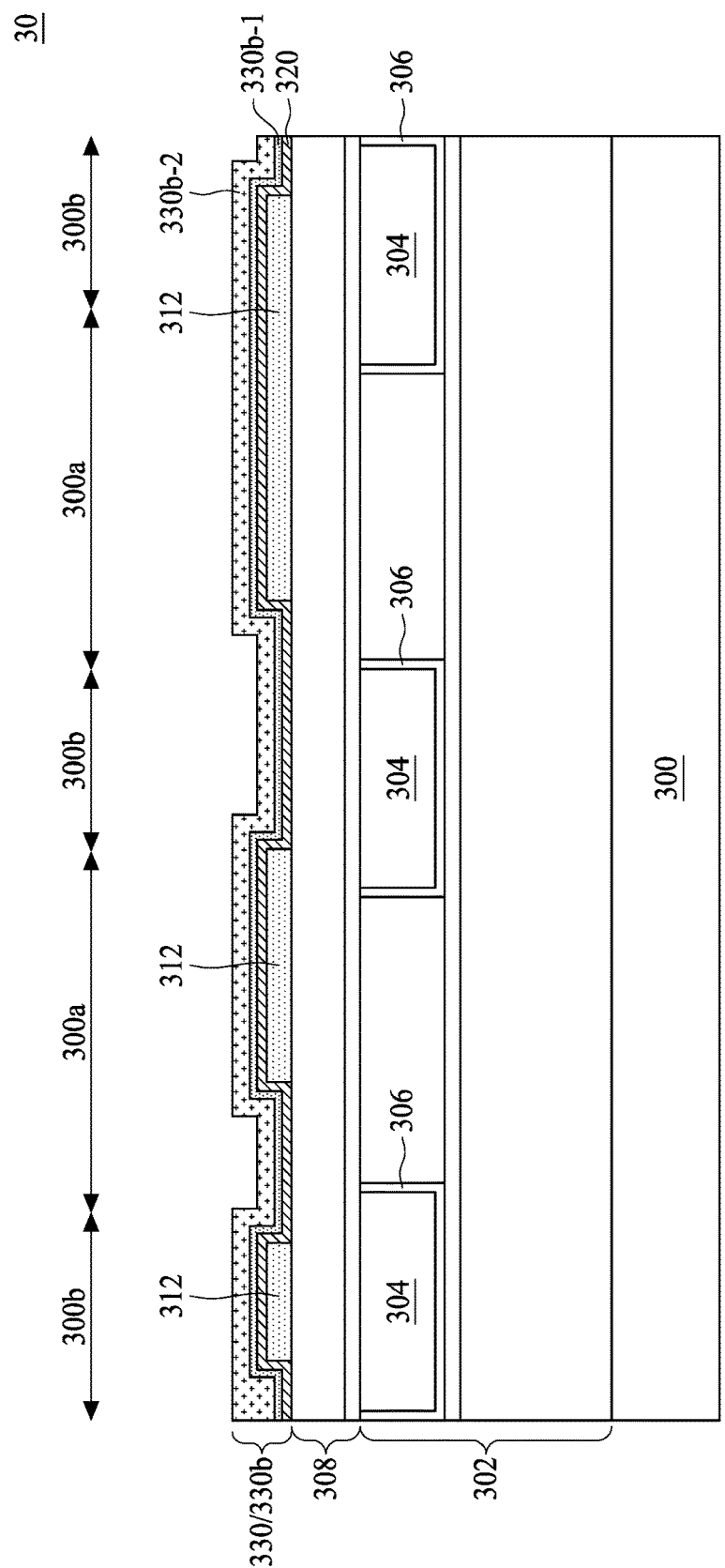

Referring to FIG. 7B, in some embodiments, the second conductive layer 330 can be a multiple conductive layer formed by an ALD and a PVD. In other words, the second conductive layer can be a multiple conductive layer 330b including an ALD-formed lower layer 330b-1 and a PVD-formed upper layer 330b-2, as shown in FIG. 7B. In some embodiments, a thickness of the ALD-formed second conductive layer 330b is between approximately 300 Å and approximately 500 Å, but the disclosure is not limited to this. In some embodiments, a ratio of a thickness of the PVD-formed upper layer 330b-2 over a thickness of the ALD-formed lower layer 330b-1 is greater than 2, but the disclosure is not limited to this. In some embodiments, the thickness of the ALD-formed lower layer 330b-1 is approximately less than 100 Å, but the disclosure is not limited to this. It should be noted that that ALD-formed lower layer 330b-1 includes a Ra value less than 0.35 nm and a Rq value less than 0.4 nm. Further, the ALD-formed lower 330b-1 serves as a smoother bottom layer and thus Ra value and Rq value of the PVD-formed upper layer 330b-2 are reduced.

Figure 8:
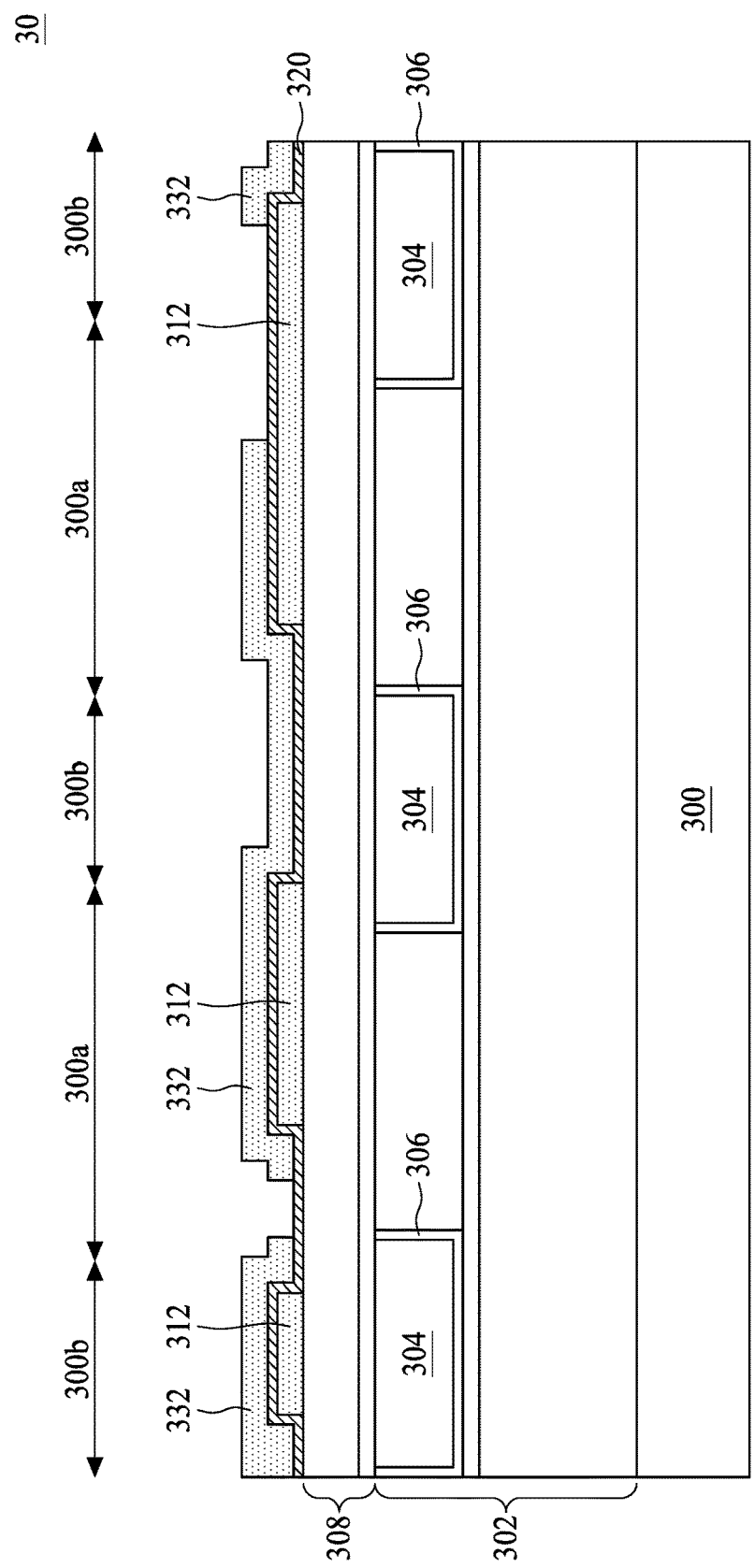

Referring to FIG. 8, the second conductive layer 330 is then patterned to form a middle electrode 332 according to operation 110.

Figure 9:
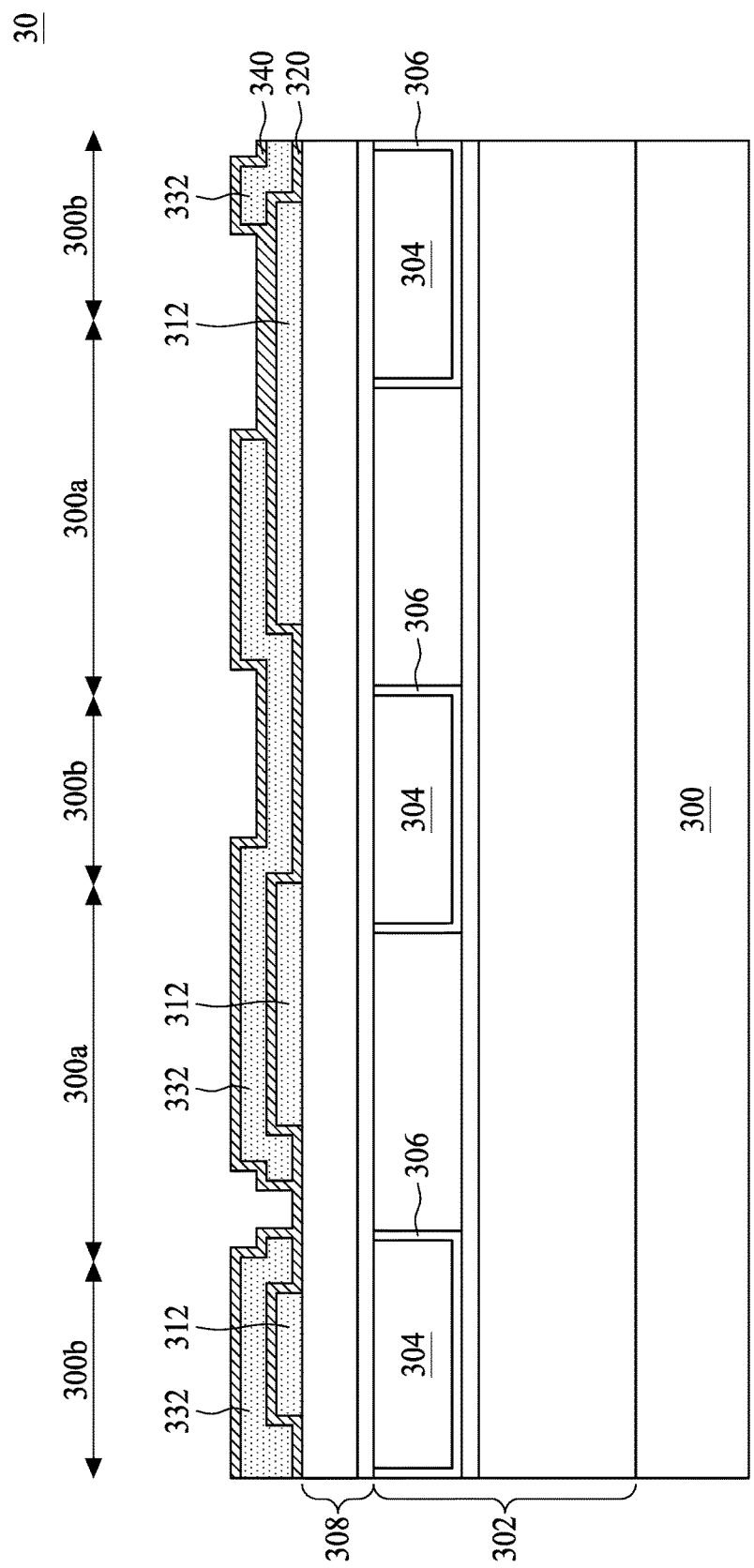

Referring FIG. 9, a second dielectric layer 340 is then formed over the middle electrode 332 according to operation 112. Further, the second dielectric layer 340 is conformally formed to cover the middle electrode 332. In some embodiments, the second dielectric layer 340 may include materials and thickness the same as the first dielectric layer 320, therefore those details are omitted for simplicity. It should be noted that since the underlying middle electrode 332, which was previously the second conductive layer 330, may include a smoother surface, the second dielectric layer 340 may be made even.

Figure 10A:
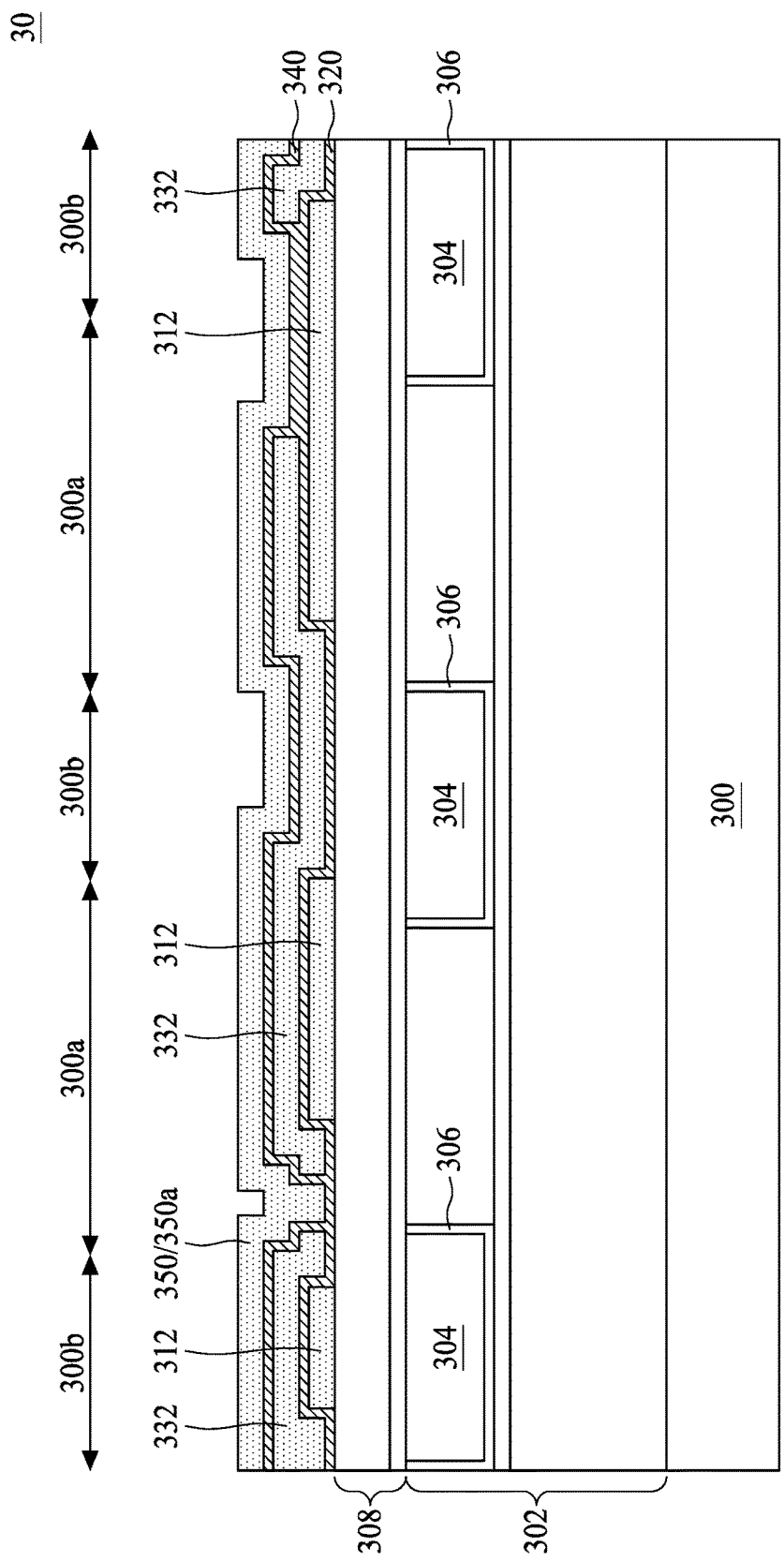

Referring to FIG. 10A, a third conductive layer 350 is formed over the second dielectric layer 340 according to operation 114. In some embodiments, the third conductive layer 350 can include materials and thickness the same as the first conductive layer 310, therefore those details are omitted for simplicity. In some embodiments, the third conductive layer 350 is a single conductive layer formed by an ALD according to operation 114. In some embodiments, a surface of the ALD-formed first conductive layer 350a includes a Ra value less than 0.35 nm and a Rq value less than 0.4 nm. As mentioned above, the lower Ra and Rq values indicate a smoother surface. In some embodiments of the present disclosure, a conductive layer completely formed PVD includes Ra value greater than 0.65 and Rq value greater than 0.7. It is therefore concluded that the ALD-formed third conductive layer 350a includes a smoother surface.

Figure 10B:
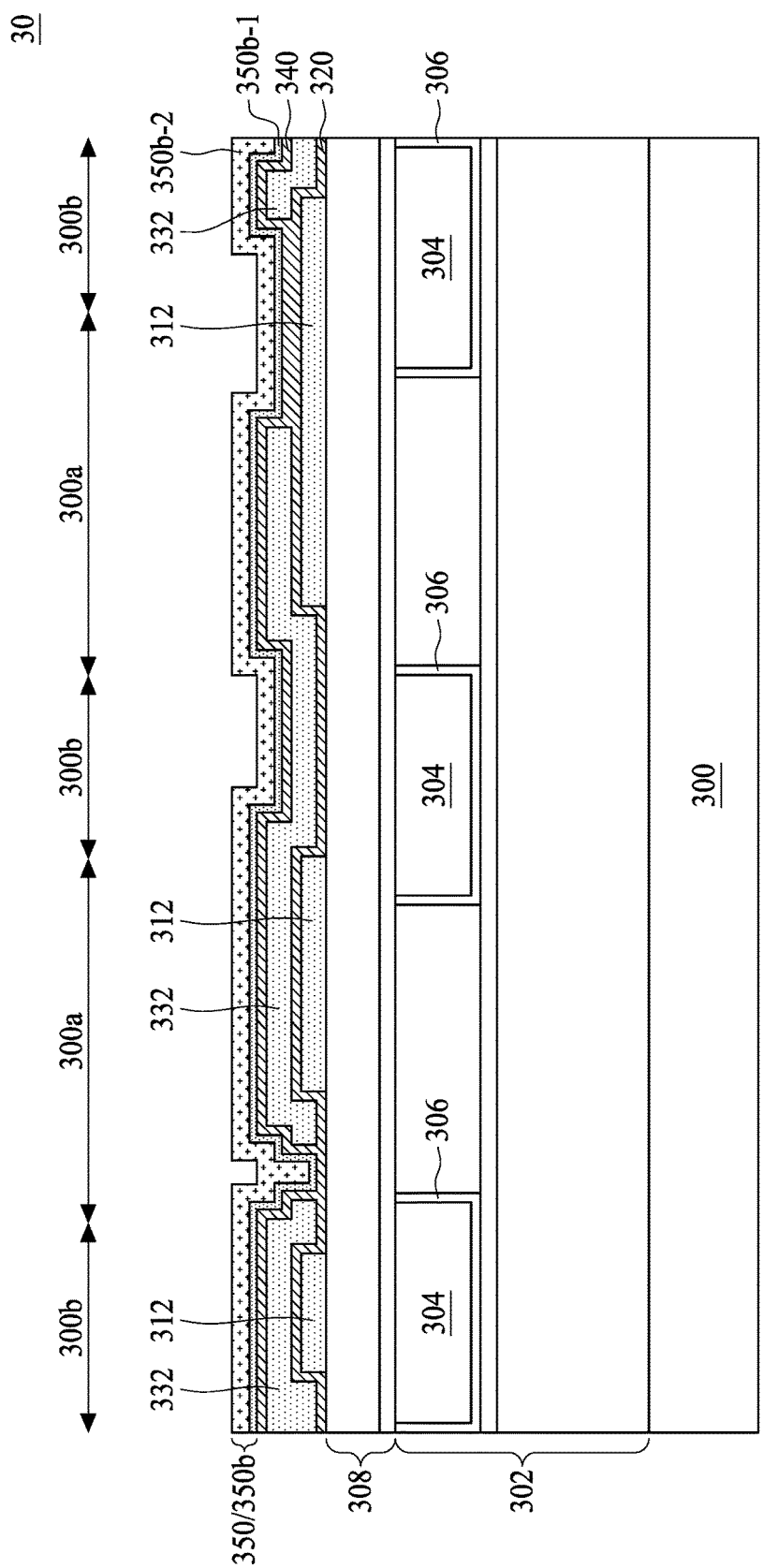

Referring to FIG. 10B, in some embodiments, the third conductive layer 350 can be a multiple conductive layer formed by an ALD and a PVD according to operation 114. And the PVD is performed after the ALD. In other words, the third conductive layer can be a multiple conductive layer 350b including an ALD-formed lower layer 350b-1 and a PVD-formed upper layer 350b-2, as shown in FIG. 10B. In some embodiments, a thickness of the ALD-formed first conductive layer 350b is between approximately 300 Å and approximately 500 Å, but the disclosure is not limited to this. In some embodiments, a ratio of a thickness of the PVD-formed upper layer 350b-2 over a thickness of the ALD-formed lower layer 350b-1 is greater than 2, but the disclosure is not limited to this. In some embodiments, the thickness of the ALD-formed lower layer 350b-1 is approximately less than 100 Å, but the disclosure is not limited thereto. It should be noted that that ALD-formed lower layer 350b-1 includes an Ra value less than 0.35 nm and a Rq value less than 0.4 nm. Further, the ALD-formed lower 350b-1 serves as a smoother bottom layer and thus Ra value and Rq value of the PVD-formed upper layer 350b-2 are reduced. In other words, the PVD-formed upper layer 350b-2 therefore obtains a smoother surface.

Figure 11:
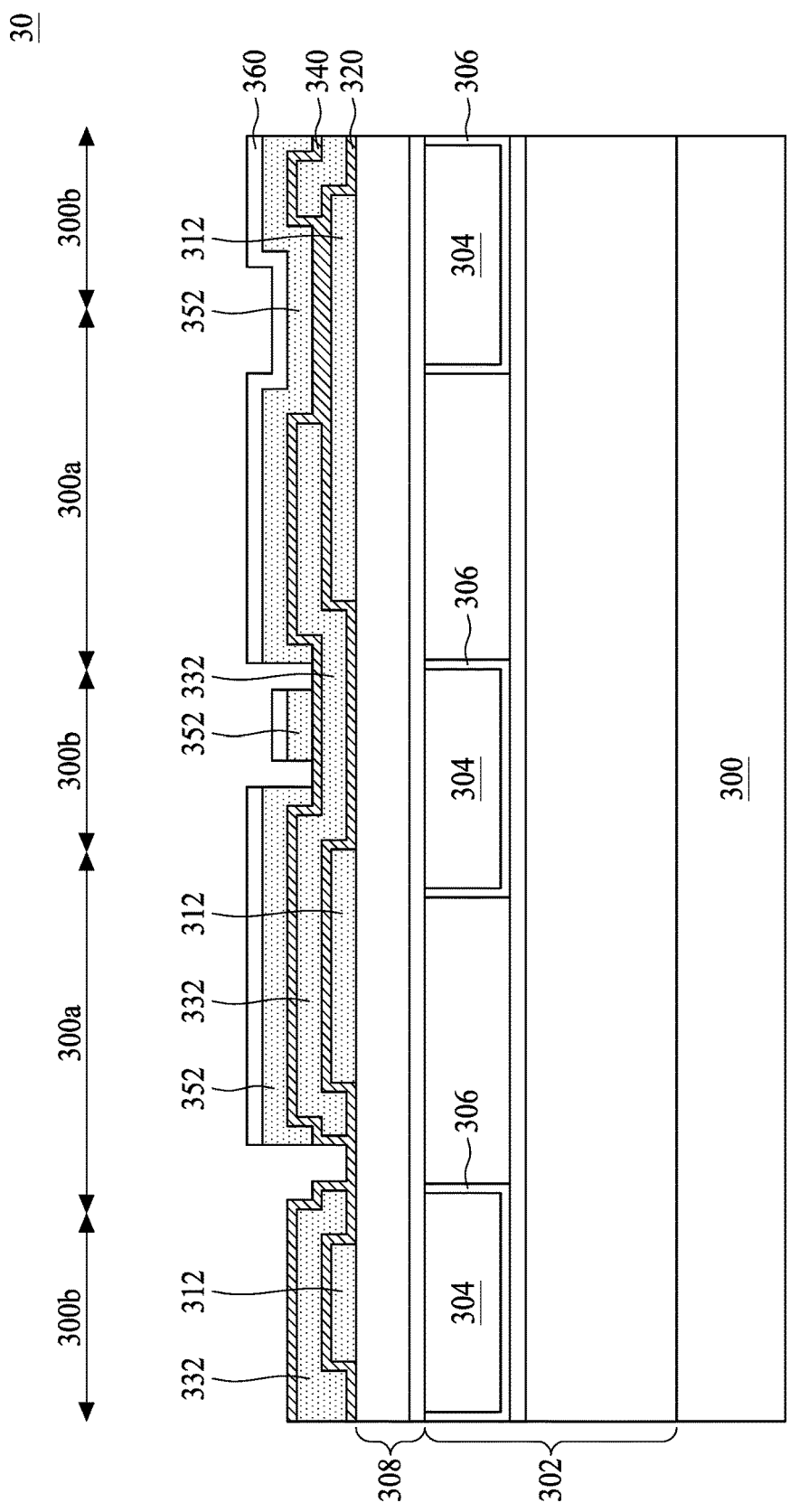

Referring to FIG. 11, in some embodiments, another insulating layer 360 is formed over the third conductive layer 350. In some embodiments, the insulating layer 360 can include materials different from the first and second dielectric layers 320 and 340, but the disclosure is not limited to this. For example, the insulating layer 360 can include SiON, but the disclosure is not limited to this. In some embodiments, a thickness of the insulating layer 360 is greater than the thickness of the first and second dielectric layers 320 and 340, but the disclosure is not limited to this. For example, the thickness of the insulating layer can be approximately 300 Å, but the disclosure is not limited to this. Next, the insulating layer 360 and the third conductive layer 350 are patterned according to operation 116, and thus a top electrode 352 is formed as shown in FIG. 11.

Figure 12:
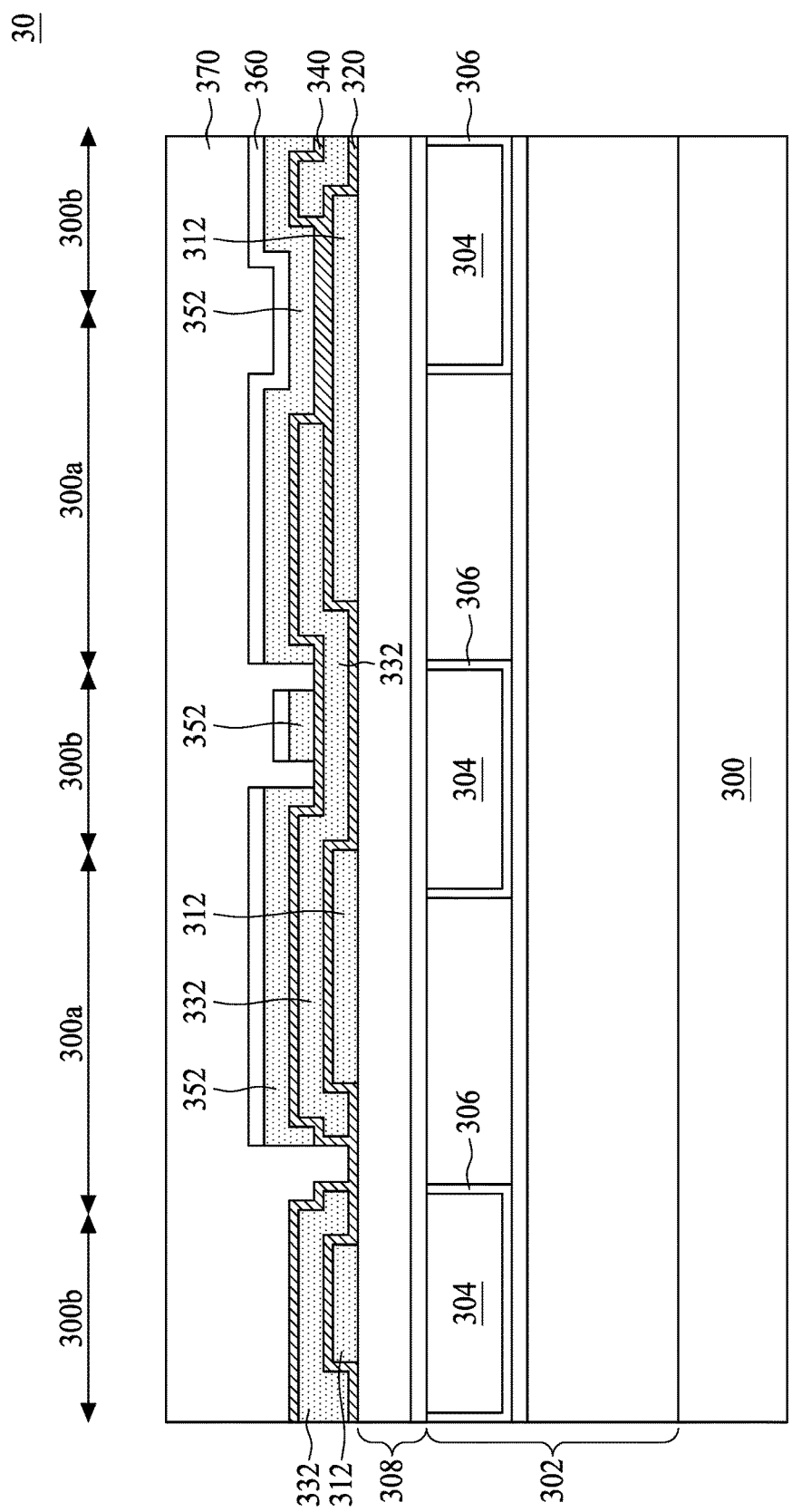

Referring FIG. 12, another insulating layer 370 is then formed over the substrate 300. In some embodiments, the insulating layer 370 includes PEOX-USG, but the disclosure is not limited to this. In some embodiments, the insulating layer 370 serves as a passivation layer, and thus a substantially even surface is formed as shown in FIG. 12. In some embodiments, the insulating layer 370 is thick enough to provide the even surface. For example but not limited to, a thickness of the insulating layer 370 can be greater than approximately 4000 Å.

Figure 13:
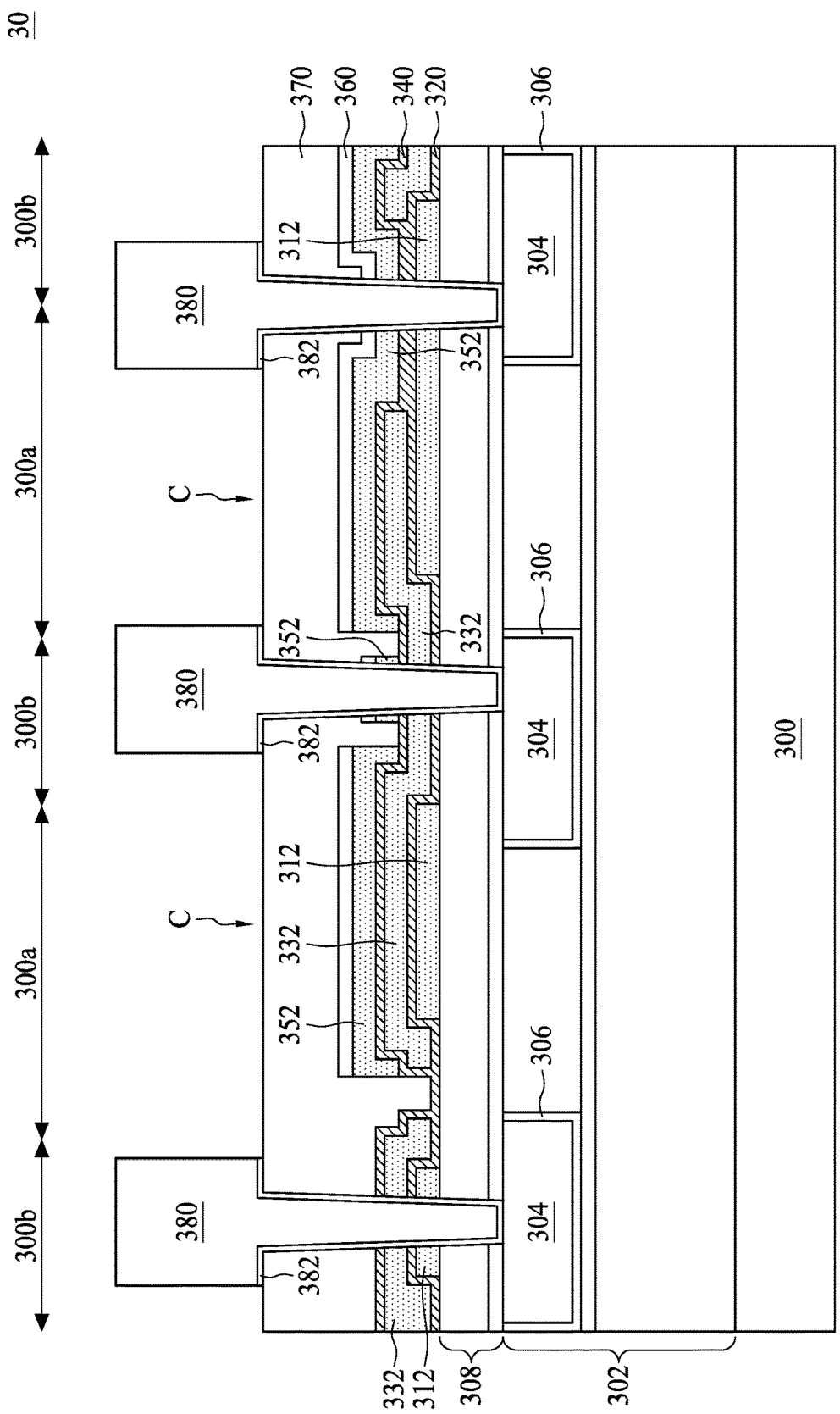
Figure 14:
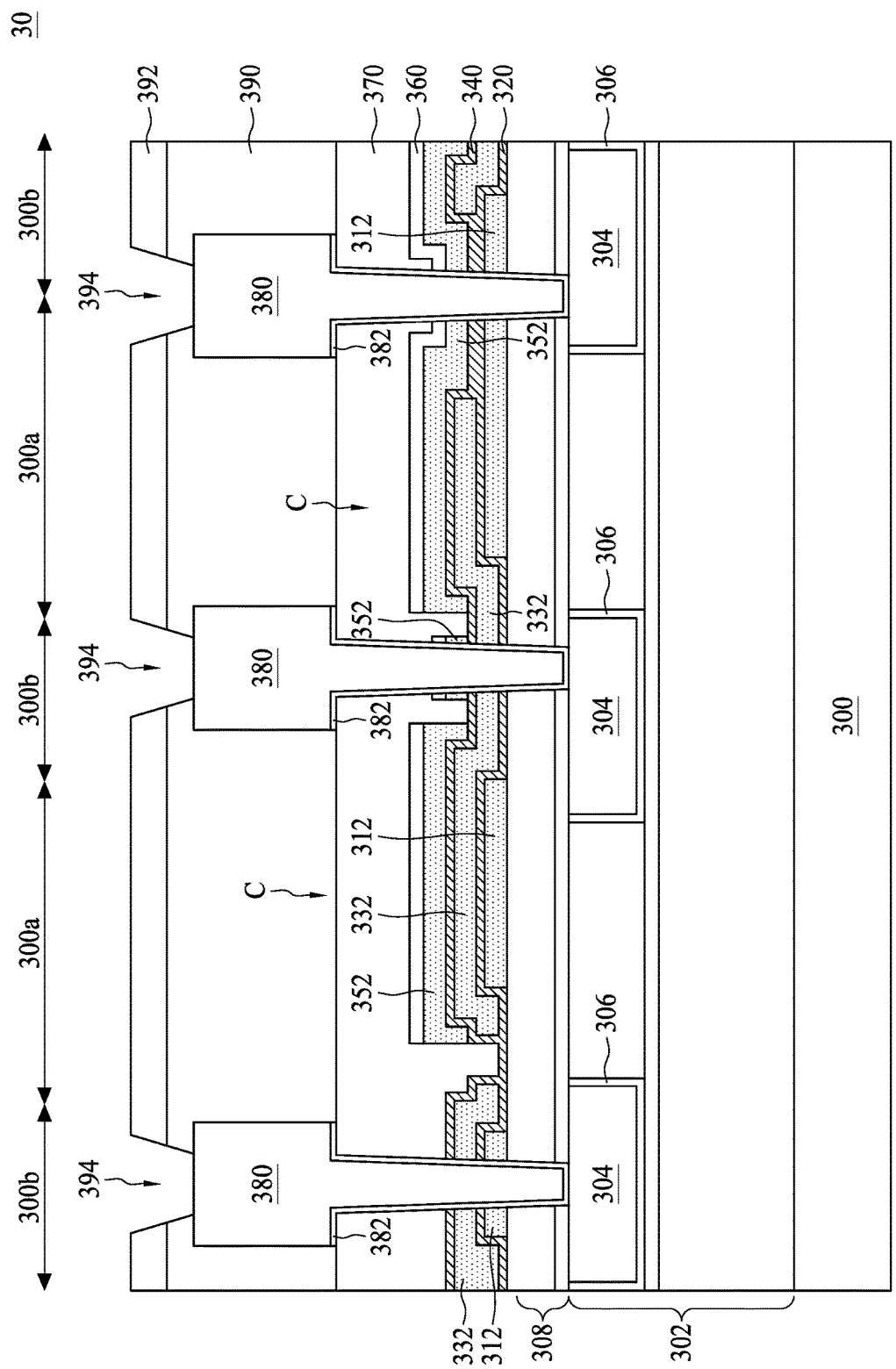

Referring to FIGS. 13 and 14, a conductor 380 is then formed over the insulating layer 370. In some embodiments, the conductor 380 can include W, Al, Cu, or AlCu, but the disclosure is not limited thereto. In some embodiments, a barrier layer 382 is sandwiched between the conductor 380 and ambient layers, as shown in FIG. 13. Further, insulating layers 390 and 392 are formed over the insulating layer 370 and the conductor 380. Next, an opening 394 is formed in the insulating layer 390 and 392 to expose the conductor 380, as shown in FIG. 14.

In some embodiments, the semiconductor structure including the MIM capacitors 30 is formed as shown in FIG. 14. The semiconductor structure 30 includes the substrate 300 including the first region 300a and the second region 300b. The MIM capacitor C includes three capacitor conductive layers 312, 332 and 352. As shown in the FIG. 14, the three capacitor conductive layers includes the bottom electrode 312 disposed in the first region 300a, the middle electrode 332 disposed over the bottom electrode 312 in the first region 300a, and the top electrode 352 disposed over the middle electrode 332 in the first region 300a. Also, the first dielectric layer 320 is sandwiched between the bottom electrode 312 and the middle electrode 332, and the second dielectric layer 340 is sandwiched between the middle electrode 332 and the top electrode 352. As mentioned above, the bottom electrode 312 can be a single ALD-formed conductive layer or a multiple conductive layer including an ALD-formed lower layer and a PVD-formed upper layer. Also, the top electrode 352 can be a single ALD-formed conductive layer or a multiple conductive layer including an ALD-formed lower layer and a PVD-formed upper layer. The middle electrode 332 can be a single ALD-formed or PVD-formed conductive layer, or a multiple conductive layer including an ALD-formed lower layer and a PVD-formed upper layer. In some embodiments, the thickness of the bottom electrode 312, the thickness of the middle electrode 332 and the thickness of the top electrode 352 are substantially the same, but the disclosure is not limited to this. In some embodiments, the thickness of the PVD-formed upper layers 310b-2/330b-2/350b-2 is greater than the thickness of the ALD-formed lower layers 310b-1/330b-1/350b-1. Because at least the top and bottom electrodes 312 and 352 are entirely or partially formed by ALD, surface roughness is reduced and a smoother surface is obtained.

It should be noted that in some embodiments, the bottom electrode 312 and the top electrode 352 respectively include a smoother surface, therefore the overlaying first dielectric layer 320 and second dielectric layer 340 are made even. Consequently, the local thinner dielectric issue, which becomes the weak point, is mitigated, and thus breakdown is alleviated. Further, damages to the dielectric layers 320/340 and the residues accumulation during patterning or etching the electrodes are both mitigated due to the smoother surface.

Still referring to FIG. 14, in some embodiments, two of the three capacitor conductive layers 312, 332 and 352 extend into the second region 300b of the substrate 300. In some embodiments, at least a conductor 380 penetrating through the two of three capacitor conductive layers 312, 332 and 352 substantially in the second region 300b. As shown in the left side of FIG. 14, the conductor 380 can penetrate through the bottom electrode 312 and the middle electrode 332. As shown in the middle of FIG. 14, the conductor 380 can penetrate through the top electrode 352 and the middle electrode 332. As shown in the right side of FIG. 14, the conductor 380 can penetrate through the top electrode 352 and the bottom electrode 312. Still referring to FIG. 14, it should be noted that the conductor 380 penetrating through the two of three conductive layers 312, 332 and 352 further penetrates through the protection layer 308 and extends to land on the conductive layer 304. Accordingly, the conductor 380 is electrically connected to the conductive layer 304.

Still referring to FIG. 14, it should be noted that there are two of three conductive layers 312, 332 and 352 electrically connected to the conductor 380. The conductor 380 exposed through the opening 394 is used to receive external signals. When voltage is applied to the MIM capacitor C, currents may flow into the MIM capacitor C through the two of the three conductive layers 312, 332 and 352 in the second region 300b. The MIM capacitor C therefore allows high frequency noise on direct current (DC) power lines to be shunted directly between the lines, preventing the noise from reaching internal devices disposed in the substrate 300 through the topmost conductive layer 304. In some embodiments, the MIM capacitor C therefore may help to provide more stable power to the internal devices. Additionally, if a power supply is required to switch between various modes of operation, an adequate decoupling capacitance can act as an energy reserve, lessening the magnitude of undesired dips in voltage during mode switching events. Accordingly, the MIM capacitor C can be taken as a filter in some embodiments of the present disclosure.

Figure 15:
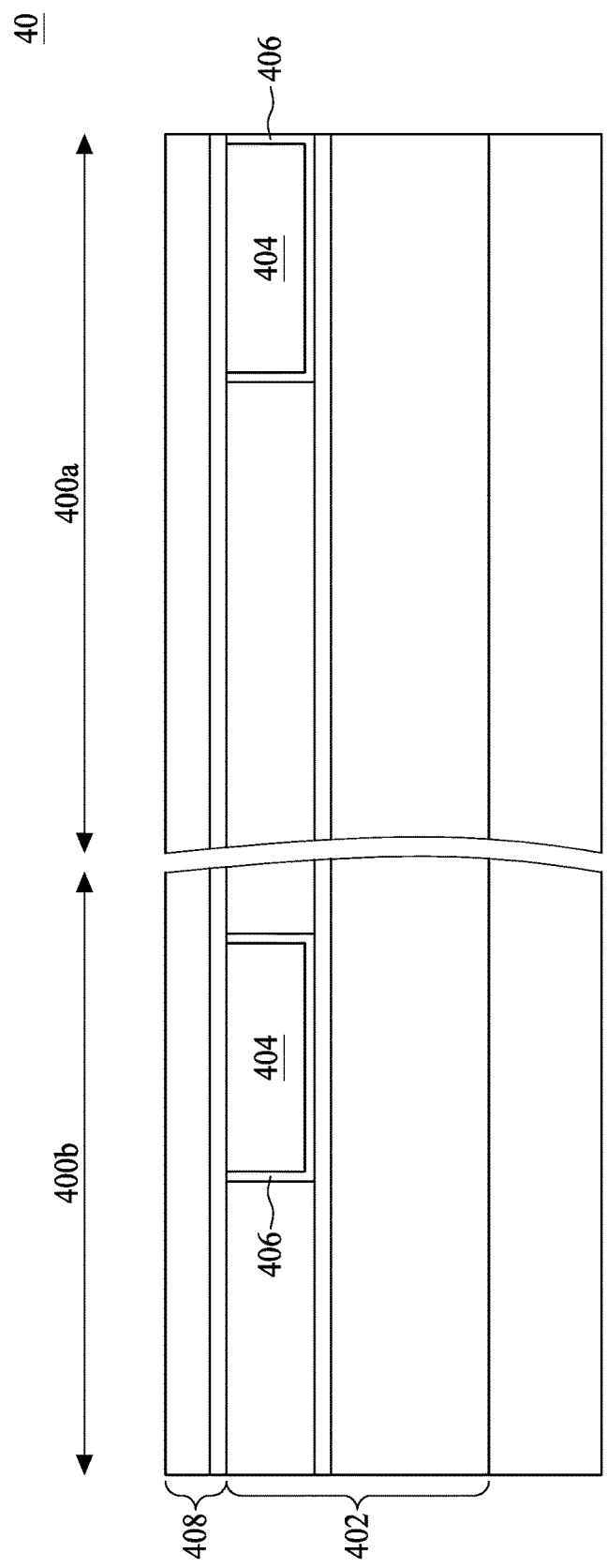
FIGS. 15-17 are schematic drawings illustrating a semiconductor structure including MIM capacitors at various fabrication stages constructed according to aspects of the present disclosure in one or more embodiments.
Figure 16:
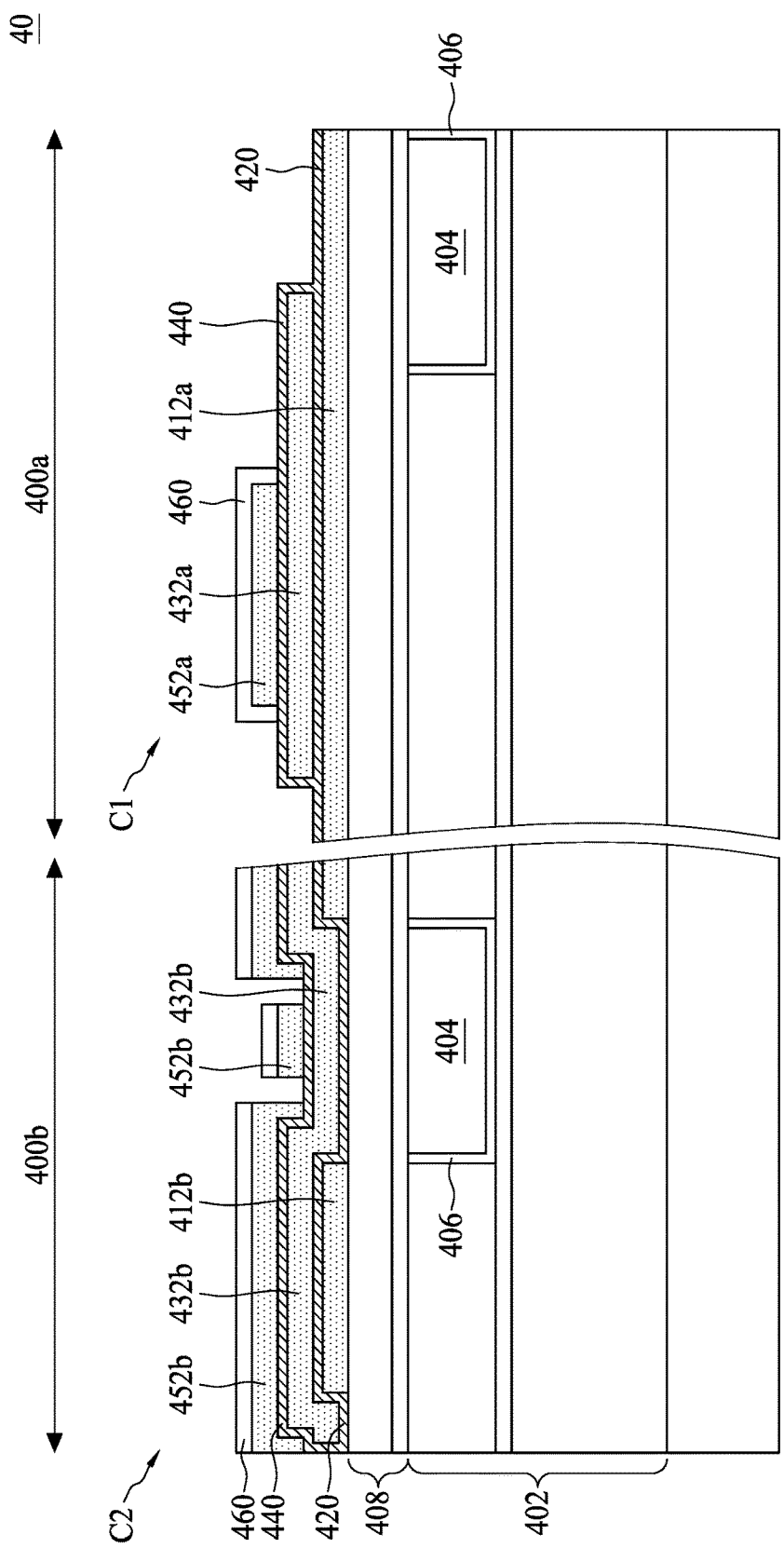
Figure 17:
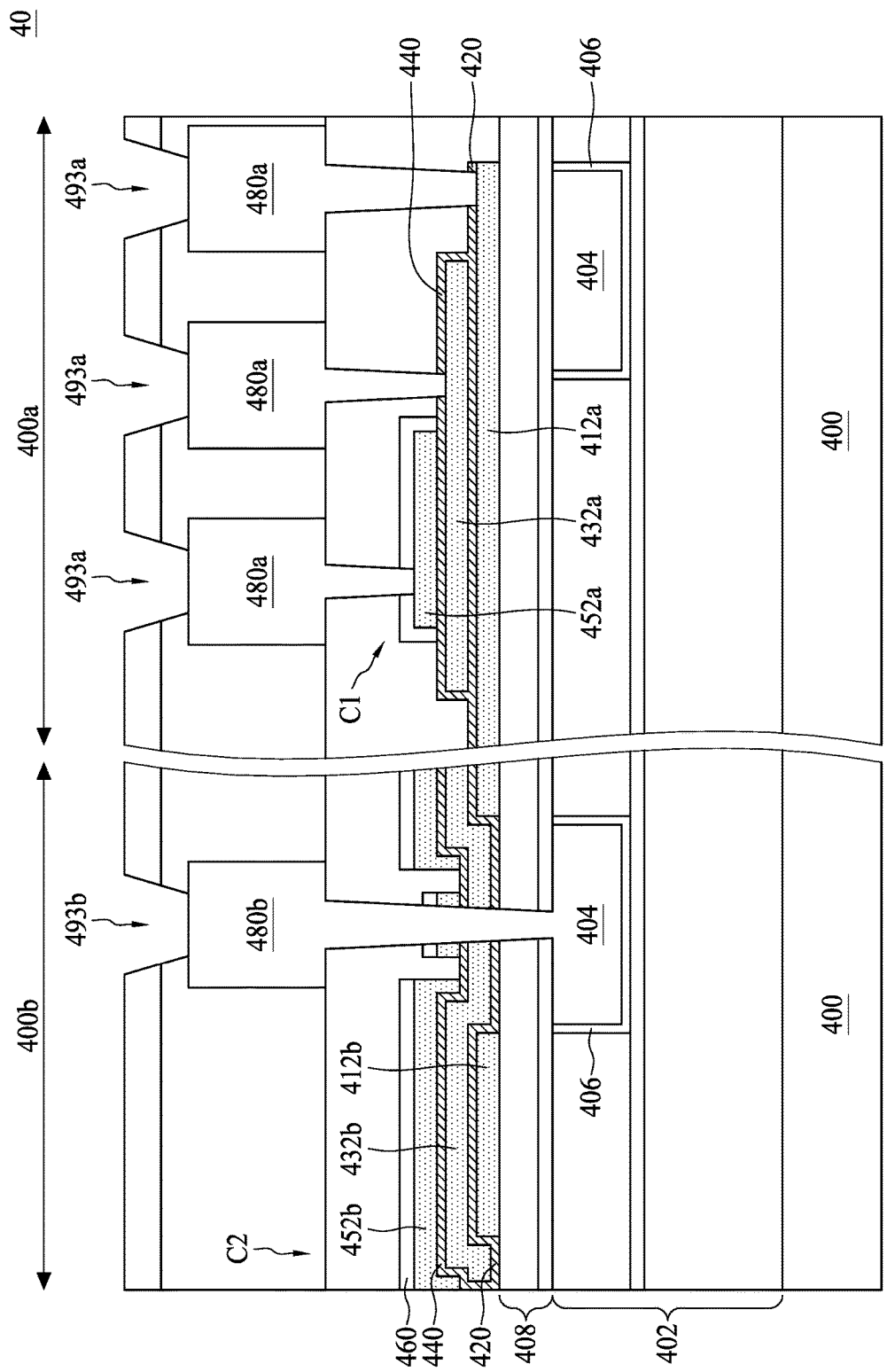

Please refer to FIGS. 15-17, which are a schematic drawing illustrating a semiconductor structure 40 including MIM capacitors according to aspects of the present disclosure in one or more embodiments. It should be easily understood that same elements in FIGS. 15-17 and FIGS. 3-14 can include similar materials, and thus those details are omitted in the interest of brevity, and only the differences are detailed. Referring to FIG. 15, a substrate 400 is received according to operation 202. A RDL 402 is disposed over the substrate 400. The RDL 404 can include a plurality of conductive layers stacked in an IMD layer. It should be noted that though only the topmost conductive layers 404 of the RDL 402 are shown in FIGS. 15-17, those skilled in the art would easily realize that other conductive layers can be disposed according to different design requirements. Additionally, a barrier layer 406 sandwiched between the conductive layers 544 and the IMD layer is provided to prevent metal diffusion, but the disclosure is not limited to this. Further, a protection layer 408 can be disposed over the RDL 402. In some embodiments, the protection layer 408 can be a multiple layer, but the disclosure is not limited to this.

Still referring to FIG. 15, the substrate 400 can include a first region 400a and a second region 400b defined thereon. In some embodiments, the first region 400a and the second region 400b are defined to accommodate different capacitors, but the disclosure is not limited to this.

Referring to FIG. 16, a first capacitor C1 is formed in the first region 400a and a second capacitor C2 is formed in the second region 400b according to operation 204. Further, the first capacitor C1 is electrically isolated from the second capacitor C2. It should be noted each elements of the first capacitor C1 and the second capacitor C2 can be formed according to the method 10, but the disclosure is not limited to thereto. For example, operations 102 and 104 can be performed to simultaneously form a first bottom electrode 412a in the first region 400a and a second bottom electrode 412b in the second region 400b. As mentioned above, the first bottom electrode 412a and the second bottom electrode 412b can be a single ALD-formed conductive layer, or a multiple conductive layer including an ALD-formed lower layer and a PVD-formed upper layer. Due to the ALD, surface roughness of the first bottom electrode 412a and the second bottom electrode 412b is reduced and a smoother surface is obtained.

Still referring to FIG. 16, operation 106 can be performed to form a first dielectric layer 420 over the first bottom electrode 412a and the second bottom electrode 412b. It should be noted that since the underlying first bottom electrode 412a and second bottom electrode 412b include smoother surfaces, the conformally formed first dielectric layer 420 is made even.

Next, operations 108 and 110 can be performed to simultaneously form a first middle electrode 432a in the first region 400a and a second middle electrode 432b in the second region 400b. As mentioned above, the first middle electrode 432a and the second middle electrode 432b can be a single ALD-formed or PVD-formed conductive layer, or a multiple conductive layer including an ALD-formed lower layer and a PVD-formed upper layer. As mentioned above, surface roughness of the first middle electrode 432a and the second middle electrode 432b can be reduced and a smoother surface can be obtained when ALD is used.

Next, operation 112 can be performed to form a second dielectric layer 440 over the first middle electrode 432a and the second middle electrode 432b.

Subsequently, operations 114 and 116 can be performed to simultaneously form a first top electrode 452a in the first region 400a and a second top electrode 452b in the second region 400b. As mentioned above, the first top electrode 452a and the second top electrode 452b can be a single ALD-formed conductive layer, or a multiple conductive layer including an ALD-formed lower layer and a PVD-formed upper layer. Due to the ALD, surface roughness of the first top electrode 452a and the second top electrode 452b is reduced and a smoother surface is obtained.

Referring to FIG. 17, a plurality of first conductors 480a is formed in the first region 400a and at least one second conductor 480b is formed in the second region 400b according to operation 206. Further, the first conductors 480a are respectively electrically connected to the first top electrode 412a, the second top electrode 432a and the third top electrode 452a, as shown in FIG. 17. On the other hand, the second conductor 480b penetrates through a pair including the second top electrode 452b and the second middle electrode 432b, a pair including the second middle electrode 432b and the second bottom electrode 412b, or a pair including the second top electrode 452b and the second bottom electrode 412b. It should be noted though only the pair including the second top electrode 452b and the second middle electrode 432b is shown in FIG. 17, those skilled in the art would easily realize other pairs according to FIG. 17, therefore those details are omitted for simplicity.

Accordingly, the semiconductor structure 40 including the MIM capacitors C1 and C2 is obtained. As mentioned above, since the electrodes of the first capacitor C1 and the second capacitor C2 can be formed by ALD, those electrodes can include smoother surfaces, and thus the overlying dielectric layers 420 and 440 can be made more even. Accordingly, not only the concentrated or crowding electrical field issue is mitigated, but also accumulation during patterning or etching the electrodes is reduced. Consequently, breakdown issue can be effectively alleviated.

Accordingly, the present disclosure provides a MIM capacitor, a semiconductor including MIM capacitors and a method for manufacturing the same. Because at least the bottom and top electrodes are formed by ALD, uneven topography issue is mitigated and thus breakdown can be prevented. Accordingly, performance of the semiconductor structure including MIM capacitor is improved.

In some embodiments, a MIM capacitor is provided. The MIM capacitor includes a bottom electrode, a middle electrode disposed over the bottom electrode, a top electrode disposed over the middle electrode, a first dielectric layer sandwiched between the bottom electrode and the middle electrode, and a second dielectric layer sandwiched between the middle electrode and the top electrode. A surface of the bottom electrode and a surface of the top electrode respectively include a Ra value lower than 0.35 nm and a Rq value lower than 0.4 nm.

In some embodiments, a semiconductor structure including MIM capacitors is provided. The semiconductor includes a substrate including a first region and a second region, a first capacitor disposed in the first region, and a second capacitor disposed in the second region. The second capacitor is electrically isolated from the first capacitor. The first capacitor includes a plurality of first electrodes, and the second capacitor includes a plurality of second electrodes. A surface of portions of the first electrodes and a surface of portions of the second electrodes respectively include an Ra value lower than 0.35 nm and a Rq value lower than 0.4 nm.

In some embodiments, a method for manufacturing a semiconductor structure including a MIM capacitor is provided. The method includes following operations. A first conductive layer is formed over a substrate by an ALD. The first conductive layer is patterned to form a bottom electrode. A first dielectric layer is formed over the bottom electrode. A second conductive layer is formed over the first dielectric layer, and the second conductive layer is patterned to form a middle electrode. A second dielectric layer is formed over the middle electrode. A third conductive layer is formed over the second dielectric layer by an ALD. The third conductive layer is patterned to form a top electrode. In some embodiments, a surface of the first conductive layer and a surface of the third conductive layer respectively include a Ra value lower than 0.35 nm and a Rq value lower than 0.4 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor comprising:
    a bottom electrode;
    a middle electrode disposed over the bottom electrode;
    a top electrode disposed over the middle electrode;
    a first dielectric layer sandwiched between the bottom electrode and the middle electrode; and
    a second dielectric layer sandwiched between the middle electrode and the top electrode,
   wherein a surface of the bottom electrode and a surface of the top electrode respectively comprise an arithmetical mean roughness (Ra) value lower than 0.35 nanometers (nm) and a root-mean-square roughness (Rq) value lower than 0.4 nm.

2. The MIM capacitor of claim 1, wherein the bottom electrode comprises a single conductive layer or a multiple conductive layer.

3. The MIM capacitor of claim 2, wherein the multiple conductive layer comprises a first lower layer and a first upper layer disposed on the first lower layer, and a thickness of the first upper layer is greater than a thickness of the first lower layer.

4. The MIM capacitor of claim 3, wherein a ratio of the thickness of the first upper layer over the thickness of the first lower layer is greater than 2.

5. The MIM capacitor of claim 1, wherein the middle electrode comprises a single conductive layer or a multiple conductive layer.

6. The MIM capacitor of claim 5, wherein the multiple conductive layer comprises a second lower layer and a second upper layer disposed on the second lower layer, and a thickness of the second upper layer is greater than a thickness of the second lower layer.

7. The MIM capacitor of claim 6, wherein a ratio of the thickness of the second upper layer over the thickness of the second lower layer is greater than.

8. The MIM capacitor of claim 1, wherein the top electrode comprises a single conductive layer or a multiple conductive layer.

9. The MIM capacitor of claim 8, wherein the multiple conductive layer comprises a third lower layer and a third upper layer disposed on the third lower layer, and a thickness of the third upper layer is greater than a thickness of the third lower layer.

10. The MIM capacitor of claim 9, wherein a ratio of the thickness of the third upper layer over the thickness of the third lower layer is greater than 2.

11. The MIM capacitor of claim 1, further comprising a conductor penetrating a pair including the bottom electrode and the middle electrode, a pair including the middle electrode and the top electrode, or a pair including the top electrode and the bottom electrode.

12. A semiconductor structure including MIM capacitors, comprising:
   a substrate comprising a first region and a second region;
   a first capacitor disposed in the first region and comprising a plurality of first electrodes; and
   a second capacitor disposed in the second region and electrically isolated from the first capacitor, the second capacitor comprising a plurality of second electrodes,
wherein a surface of portions of the first electrodes and a surface of portions of the second electrodes respectively comprise an Ra value lower than 0.35 nm and a Rq value lower than 0.4 nm.

13. The semiconductor structure of claim 12, further comprising a plurality of first conductors disposed in the first region and respectively electrically connected to the first electrodes, wherein the first electrodes of the first capacitor comprise a first bottom electrode, a first middle electrode and a third top electrode, and the first conductors are respectively electrically connected to the first bottom electrode, the first middle electrode and the first top electrode.

14. The semiconductor structure of claim 12, further comprising at least one second conductor disposed in the second region, wherein the second electrodes of the second capacitor comprise a second top electrode, a second middle electrode and a second bottom electrode, the second conductor penetrates a pair comprising the second top electrode and the second middle electrode, a pair comprising the second middle electrode and the second bottom electrode, or a pair comprising the second top electrode and the second bottom electrode.

15. The semiconductor structure of claim 12, wherein the first electrodes and the second electrodes respectively comprise a single layer or a multiple layer.

16. The semiconductor structure of claim 15, wherein the multiple conductive layer comprises a lower layer and an upper layer disposed on the lower layer, and a thickness of the upper layer is greater than a thickness of the lower layer.

17. A method for manufacturing a semiconductor structure including a MIM capacitor, comprising:
   forming a first conductive layer over a substrate by an atomic layer deposition (ALD);
   patterning the first conductive layer to form a bottom electrode;
   forming a first dielectric layer over the bottom electrode;
   forming a second conductive layer over the first dielectric layer;
   patterning the second conductive layer to form a middle electrode;
   forming a second dielectric layer over the middle electrode;
   forming a third conductive layer over the second dielectric layer by an ALD; and
   patterning the third conductive layer to form a top electrode,
wherein a surface of the first conductive layer and a surface of the third conductive layer respectively comprise a Ra value lower than 0.35 nm and a Rq value lower than 0.4 nm.

18. The method of claim 17, wherein the first conductive layer and the third conductive layer are respectively formed by the ALD and a physical vapor deposition (PVD).

19. The method of claim 17, wherein the second conductive layer is formed by an ALD operation or a physical vapor deposition (PVD) operation.

20. The method of claim 17, wherein a thickness of the first conductive layer, a thickness of the second conductive layer and a thickness of the third conductive layer are substantially the same.

* * * * *